United States Patent [19]

Roy et al.

[11] Patent Number: 4,906,861
[45] Date of Patent: Mar. 6, 1990

[54] SUPERCONDUCTING CURRENT REVERSING SWITCH

[75] Inventors: Apurba Roy, Whitehall, Pa.; David M. Coffey, Knoxville, Tenn.

[73] Assignee: Cryomagnetics, Inc., Oak Ridge, Tenn.

[21] Appl. No.: 251,294

[22] Filed: Sep. 30, 1988

[51] Int. Cl.$^4$ .............................................. H01F 36/00
[52] U.S. Cl. .................................. 307/138; 323/360; 361/141; 505/851
[58] Field of Search ..................... 307/138; 323/360; 335/216; 336/DIG. 1; 361/141; 363/63, 14

[56] References Cited

U.S. PATENT DOCUMENTS

| | | | |
|---|---|---|---|
| 2,946,030 | 7/1960 | Slade | 336/DIG. 1 |
| 3,956,727 | 5/1976 | Wolf | 335/216 |
| 4,164,777 | 8/1979 | Kneip et al. | 361/331 |
| 4,544,979 | 10/1985 | Ennis et al. | 361/19 |
| 4,586,017 | 4/1986 | Laskaris et al. | 361/19 |
| 4,602,231 | 7/1986 | Purcell et al. | 335/216 |
| 4,763,221 | 8/1988 | Takechi | 335/216 |
| 4,807,084 | 2/1989 | Takechi | 361/19 |

Primary Examiner—Patrick R. Salce
Assistant Examiner—Jeffrey Sterrett
Attorney, Agent, or Firm—Pitts and Brittian

[57] ABSTRACT

A superconducting switching device having no moving components for reversing current flow through a load. This load typically is a superconducting magnet and, in this application, the present invention also selectively serves as a persistent switch. The invention includes a pair of switching units connected between the load (magnet) and a current source. These switching units each have a pair of superconductor members and a mechanism for selectively producing in the switching units either a substantial electrical resistance or no resistance. Through the use of a control logic, the level of resistance of the switching units can be changed to effect the direction of current flow. In the case of the superconductor magnet, both switch units can be simultaneously made to have substantially zero resistance, and their interconnection forms the persistent switch for the superconducting magnet.

13 Claims, 6 Drawing Sheets

SUPERCONDUCTING CURRENT REVERSING SWITCH

TECHNICAL FIELD

The present invention relates generally to switching means to interrupt and/or reverse electrical current flow, and more particularly to a superconducting switch for reversing the direction of current flow into a high current device without the use of heavy duty relays and/or mechanical switches. It is of particular value for reversing the direction of current flow through superconducting magnets.

BACKGROUND ART

In the art of operating superconductor magnets, current is initially supplied from an external source to coils of the magnet (cooled below their critical temperature) until the desired level of operation is achieved. During this charging, a persistent switch across the magnet is maintained at a condition such that it exhibits a high resistance. When the desired current flow is reached in the magnet, the condition of the persistent switch is changed so as to exhibit substantially zero resistance so that the magnet current is completely shunted therethrough. At this point, the source can be turned off and/or disconnected using a mechanical switch or a disconnect of the type shown and described in U.S. Pat. No. 4,544,979. Numerous persistent switches are known in the art, and are typified by those of U.S. Pat. Nos. 4,164,777 issued to G. Kneip, Jr., et al., on Aug. 14, 1979, and 4,586,017 issued to E. Laskaris, et al., on Apr. 29, 1986. The persistent switches are then used to discharge energy stored in the magnet when operation of the magnet is to be intentionally stopped by changing the switch back to the high resistance state and routing the magnet's current through an energy absorbing device of some type.

There are types of superconductor magnet operation where the direction of current flow through the magnet needs to be reversed for the particular application of the magnet. To date, this reversal has been accomplished by mechanical or electro-mechanical switches (see FIG. 1) or by using expensive bi-polar power supplies. Electro-mechanical switches have traditionally been preferred for economic reasons. Due to the large currents flowing in the magnet, these switches must be structured to deal with these currents and the energy that can be stored in the magnet. These switches, as such, have moving components, heavy duty contacts and occupy considerable space. The making and breaking of high current contacts entailed in the operation of these switches render them prone to mechanical problems, particularly when operated frequently. In addition, since the power leads to the superconducting magnet must be physically opened during the reversing process using these switches, there are serious operator safety concerns as potentially fatal high voltages can occur. One should note that these current reversing devices have been required in addition to the persistent switch in a given magnet system.

In view of the state-of-the-art in superconducting magnet current switching, it is an object of the present invention to provide a switching system for reversing current flow in a magnet without the use of mechanical components.

It is another object of the present invention to provide a compact and non-mechanical switching system for use in reversing current flow to superconducting magnets and other high current devices.

It is a further object of the present invention to provide a superconducting switch for use in reversing the direction of current flow in a high current device.

An additional object of the present invention is to provide a superconducting switch useful for both reversing current flow and functioning as a persistent switch for superconducting magnets and the like.

These and other objects of the present invention will become apparent upon a consideration of the drawings identified below, and the full description thereof.

DISCLOSURE OF THE INVENTION

In accordance with the present invention, there is provided a simple and inexpensive superconducting switch for use as a switch to reverse the direction of current flow through a high current device, e.g., a superconducting magnet and/or as a persistent switch for such magnet. This superconducting switch actually consists of two thermally isolated superconducting switch units. Each switch unit of an illustrated embodiment contains two electrically-isolated but thermally-connected superconductors in a cryogenic environment, together with an electrically-isolated but thermally-connected heater element. Through the use of a control logic, the heater elements are either energized to inhibit current flow through the two superconductors of a selected switch unit, or de-energized to permit current flow. This logic controls the direction of current flow through the magnet from the current source, or causes the switch units to function as a persistent switch.

BEST MODE FOR CARRYING OUT THE INVENTION

Figure 1:
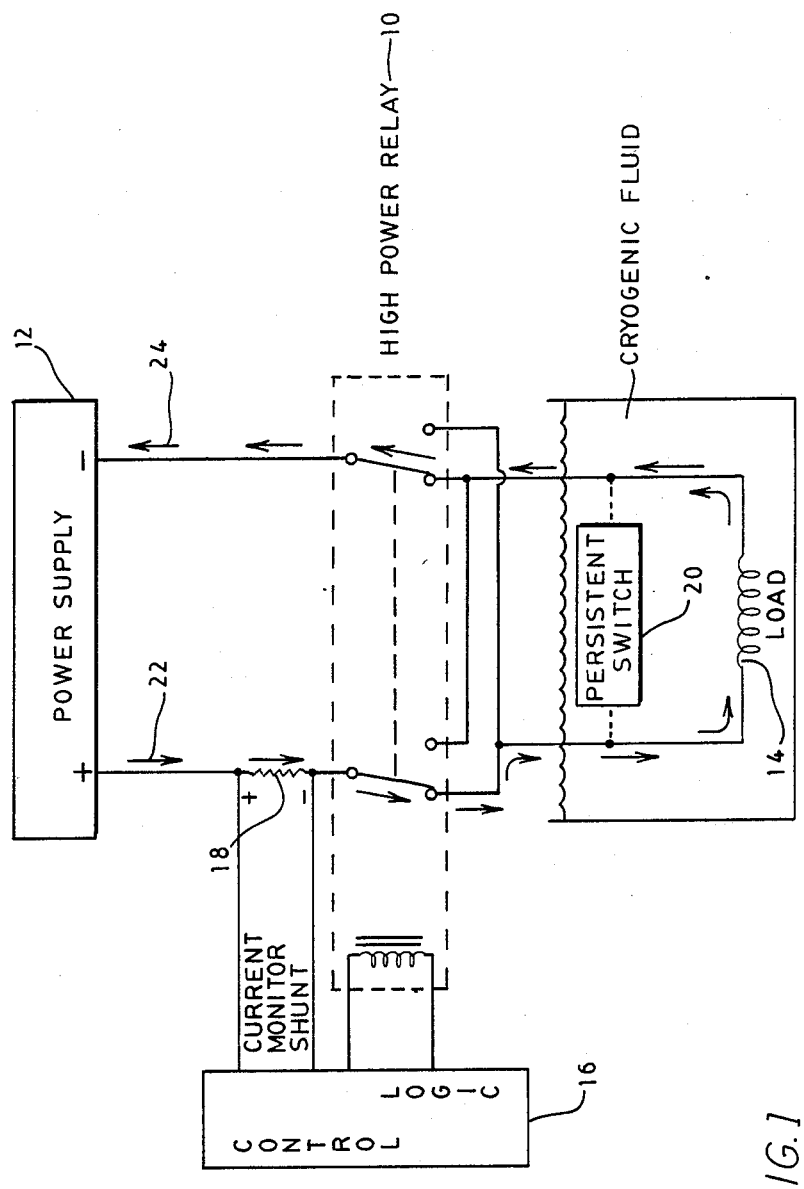
FIG. 1 is a schematic diagram of the prior art system of reversing current flow into a superconducting magnet or other high current load.

For a better understanding of the present invention, a brief description of a typical prior art switching system is described with reference to FIG. 1. A double pole, double throw high power relay 10 is used to connect a power supply 12 to a load 14 in the form of a superconducting magnet or other high-current load. The supply 12 can include a main disconnect if desired. Alternatively, a disconnect of the type of U.S. Pat. No. 4,544,979, can be used. This relay 10 is operated via a control logic circuit 16 so as to reverse the direction of current flow through the magnet according to preset intervals or upon demand. Magnitude of the current is typically sensed by a current monitor shunt 18, as illustrated. A conventional persistent switch 20 is shown in one typical location in the circuit. The magnet (load 14 and the persistent switch 20 are operated at cryotemperatures sufficient to achieve superconductivity of the appropriate wires. It should be noted that the relay 10 is not at cryotemperature. The current to and from the magnet is shown by arrows 22 and 24, respectively.

Figure 2:
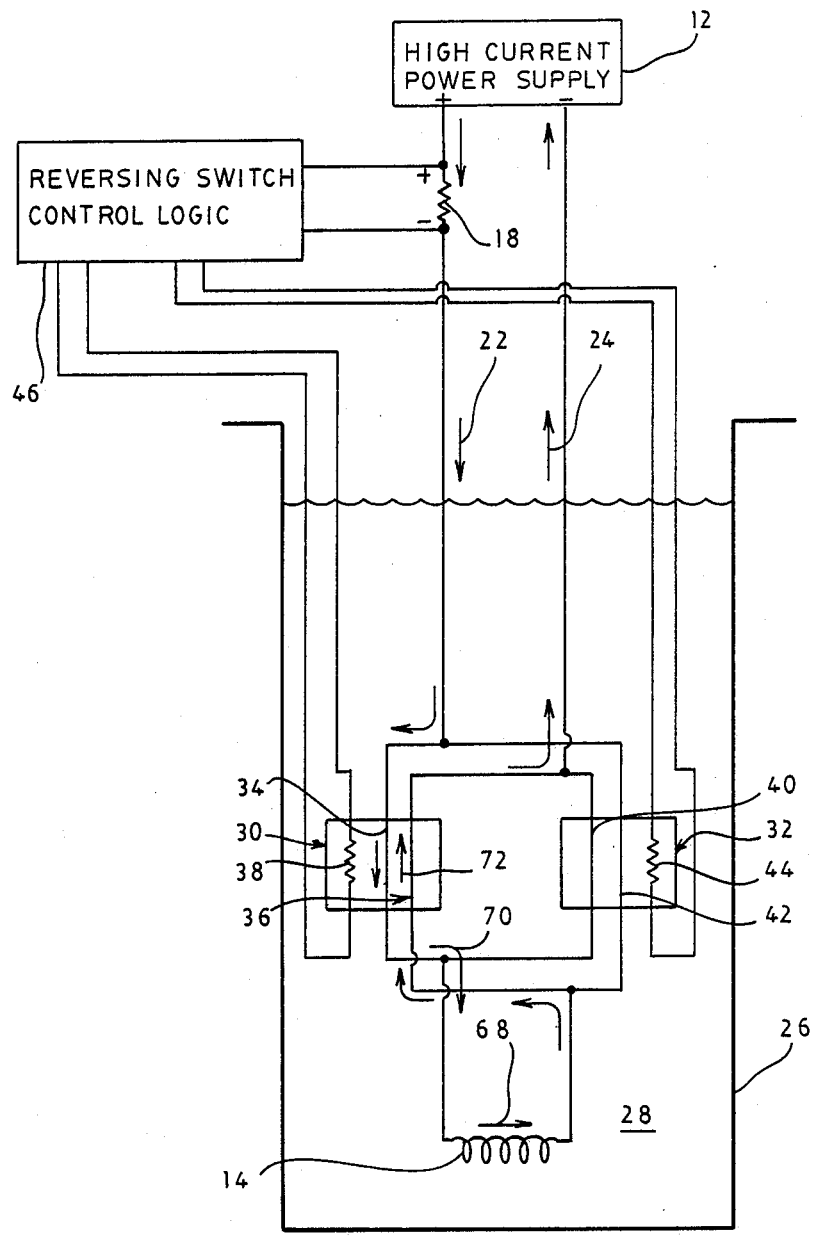
FIG. 2 is a schematic drawing illustrating a superconducting switch device for reversing current flow to a superconducting magnet indicating "positive" current flow into the magnet.

One embodiment of the present invention is illustrated in FIG. 2. All of the components of this embodiment that are the same as in FIG. 1 carry the same identification numbers: e.g., power supply 12, magnet 14, and current monitor shunt 18. Likewise, the current flow created by the source 12 are shown by the corresponding arrows 22, 24. This particular embodiment is illustrated having a conventional cryotank (dewar) 26 filled with an appropriate cryofluid 28. Although not illustrated, the tank 26 is normally provided with a cover and suitable insulation to prevent excessive evaporation of the fluid 28 during operation of the system. Alternatively, the cryofluid can flow through channels proximate to the magnet windings to achieve a temperature below the critical temperature of the superconductor windings of the magnet.

Positioned within the cryofluid 28 (or otherwise suitably cooled) are a pair of switch units 30, 32, the details of which are given hereinafter with regard to FIG. 3. Switch unit 30, for example, contains a pair of wires 34, 36, fabricated from a material that exhibits superconducting properties. Typically this is the same superconductor material as used for windings of the magnet. These wires are electrically isolated but thermally connected. Switch unit 30 also contains a heater 38 that is electrically isolated but thermally connected to wires 34, 36. In a similar or identical construction, switch unit 32 has a pair of superconductor wires 40, 42 and a heater 44.

The superconductor wires 34, 36 and 40, 42 are connected so as to potentially carry current from the source 12 to the magnet 14. The heaters 38, 44 are connected to a power source within a reversing switch control logic component 46 for purposes described hereinafter. No persistent switch is shown in this FIG. 2 since, as discussed below, the switch units 30, 32 can function as a persistent switch in addition to switching the direction of current flow in the magnet.

Figure 3:
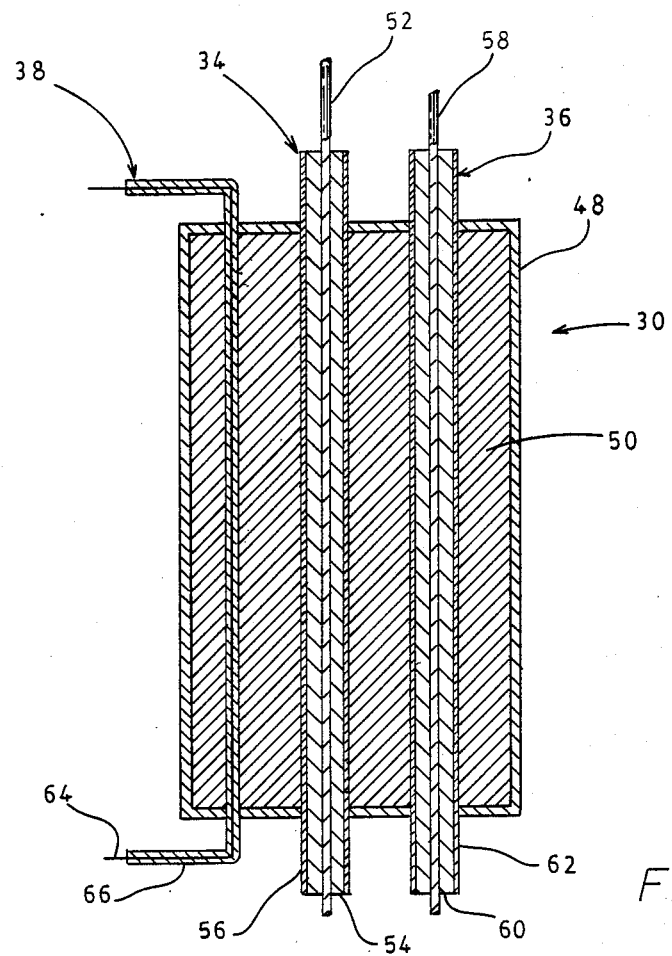
FIG. 3 is an enlarged cross-sectional drawing of the switching units depicted in FIG. 2 (and FIGS. 4 through 6).

FIG. 3 illustrates in cross-section, at least schematically, the construction of one of the switching units, e.g., switch unit 30. Typically, there is a suitable container 48 which is made of a material of intermediate thermal conductivity, for example, fiberglass. This container is filled with an epoxy potting material 50 having high thermal conductivity. Typically, this potting material can be Stycast 2850 as manufactured by Emerson and Cummings. Penetrating the container 48 and the potting are the two superconductors 34, 36. Superconductor 34 typically is fabricated from a superconductor filament or filaments 52, usually of the same composition as that used in the magnet 14. This filament(s) is in an electrically resistive matrix 54, such as Cu-Ni, and the exterior is a circumferential electrically insulative sheath 56. Similarly, superconductor 36 has a superconducting filament or filaments 58 in a matrix 60 with an insulative sheath 62. The heater 38 has a central resistive heater element 64 covered with electrical insulation 66. Although not shown in this FIG. 3, suitable cooling means is required to normally achieve a temperature below the critical temperature of the superconductor material. This can be achieved by immersing the container in a suitable cryofluid, or by flowing the fluid in channels proximate the superconductors 34, 36.

Thus, it can be seen that each of the superconductor wires 34, 36, and the heater 38, are electrically isolated from each other; however, they are thermally coupled by the potting material 50.

Referring again to FIG. 2, it can be seen that both of the switching units 30, 32 are subjected to the cryofluid 28. Their actual temperature, however, is either substantially the same as the cryofluid when heaters 38, 44 are not energized, or at some slightly elevated temperature (with respect to the critical temperature) when the heaters are energized. In the operation depicted in this figure, heater 38 is not energized and heater 44 is energized. Thus, the resistance of elements 34, 36 is substantially zero, and the current flow in magnet 14 is in a direction indicated with arrow 68, with currents in superconductors 34, 36 being in directions indicated by arrows 70, 72, respectively. There is no current flow in switch unit 32 because the heater 44 maintains a temperature at which elements 40, 42 have a relatively high resistance.

Figure 4:
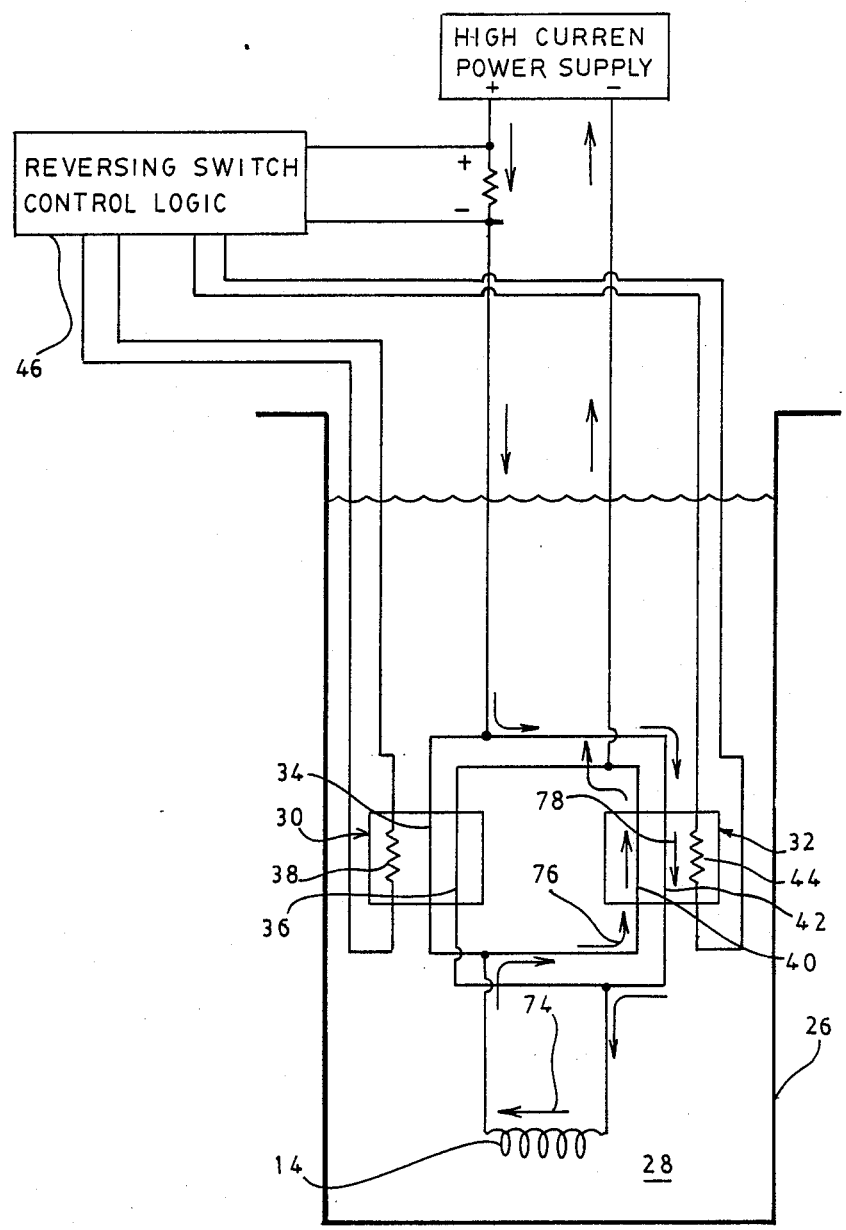
FIG. 4 is a schematic drawing of the switch device illustrated in FIG. 2, with the switch units operated to provide "negative" current flow into the magnetic.

When current reversal is desired, the control logic 46 reverses the operation of the heaters 38, 44 whereby the elements 34, 36 of switch unit 30 become "resistive" and elements 40, 42 of switch unit 32 become superconducting. This condition is illustrated in FIG. 4 whereby current flows are in a direction indicated by arrows 74, 76 and 78. This switching between the conditions of FIG. 2 and FIG. 4 can be pre-programmed into the control logic 46, or can be initiated through the control logic upon specific demand.

Figure 5:
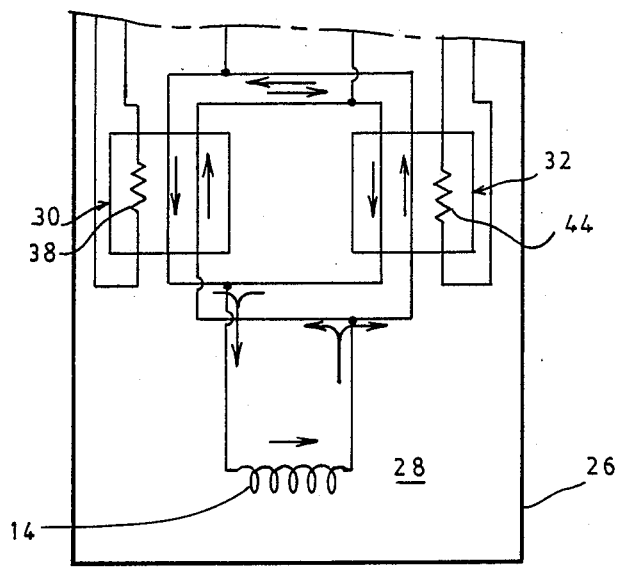
FIG. 5 is a schematic drawing illustrating the use of the present device as a persistent switch for positive current flow in the magnet.

When current flow is in the direction indicated in FIG. 2 and the magnet is at desired operating conditions, there is no further need to supply current to the system from supply 12. It is at this point that a normal persistent switch is made superconducting to carry the magnet current as a shunt. As stated above, the system described herein can also serve as a persistent switch. This is indicated in FIG. 5 where the current flow through the magnet 14 is in the same direction as in FIG. 2. The heater 44 is de-energized whereby both switching units 30, 32 become superconducting. Thus, the current paths will be as indicated in FIG. 5. The supply 12 can then be disconnected by any suitable means.

Figure 6:
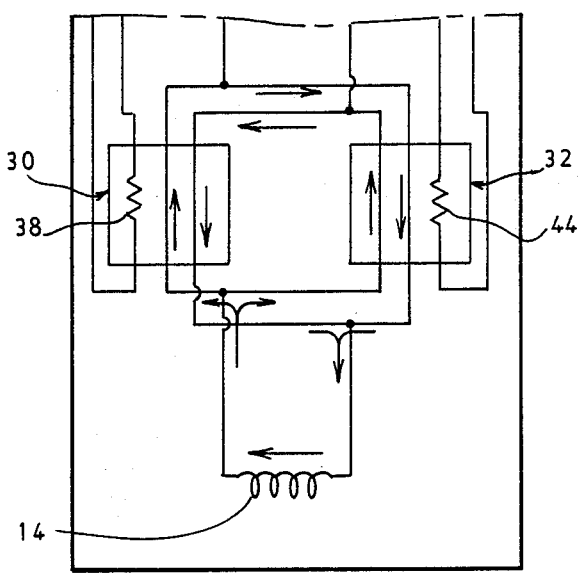
FIG. 6 is a schematic drawing illustrating the use of the present device as a persistent switch for negative current flow through the magnet.

Similarly, if magnet current has been flowing in the direction illustrated in FIG. 4, with heater 38 energized and heater 44 de-energized, the system of the present invention can perform as a persistent switch by de-energizing heater 38 whereby both switch units 30, 32 are superconducting. The persistent current paths in this case will be as indicated in FIG. 6. The power source can then be disconnected by any suitable means.

Figure 7:
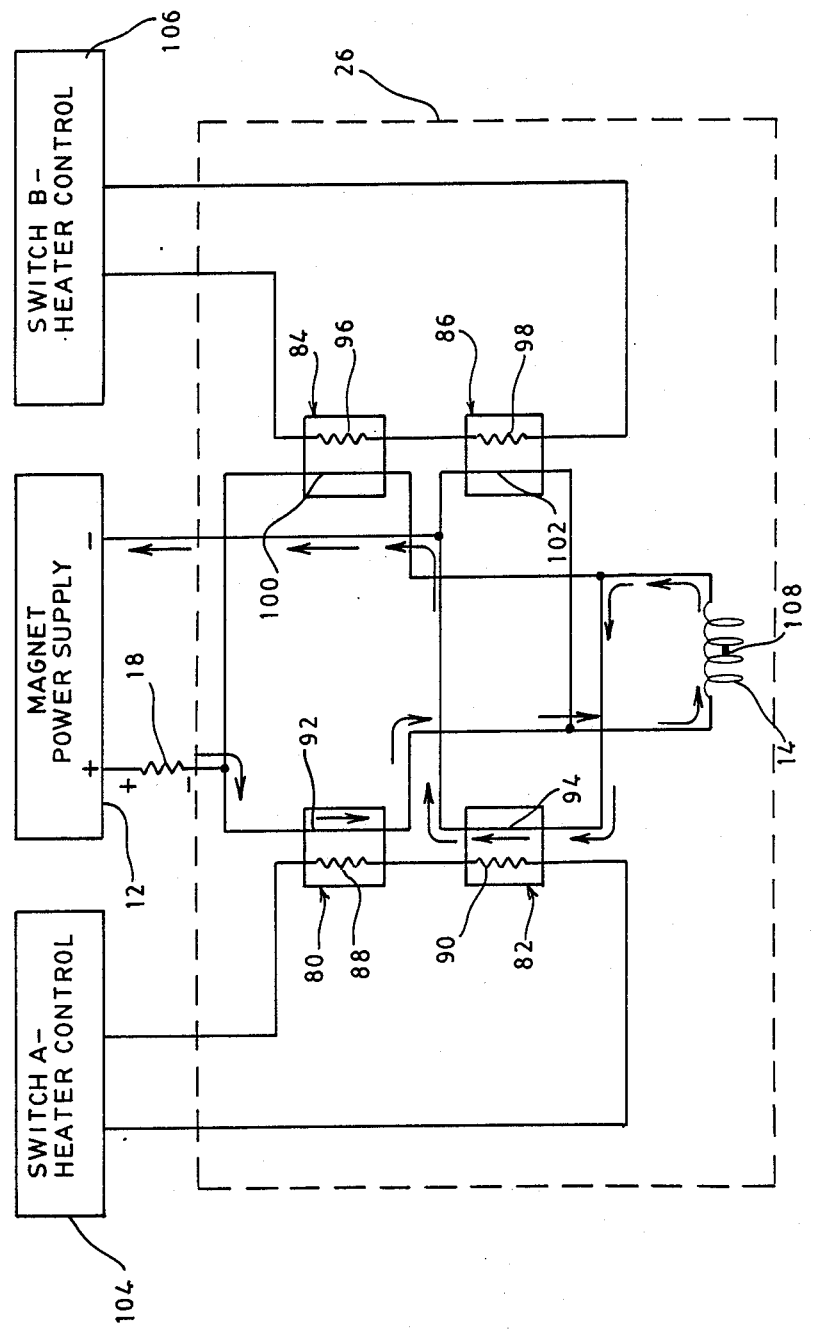
FIG. 7 is a schematic drawing illustrating a circuit initially utilized to demonstrate the present invention.

The present invention was initially demonstrated using the circuit shown in FIG. 7. This circuit is the same as that of FIGS. 2 and except that each switching unit (30, 32 of FIG. 2) is divided so as to utilize commercially available components, i.e., persistent switches. Thus, switch components 80, 82 of FIG. 7 are equivalent to switch unit 30, and switch components 84, 86 are equivalent to switch unit 32. Switch components 80, 82 each have a heater 88, 90 and a superconductor filament 92, 94, respectively. Similarly, switch components 84, 86 each have a heater 96, 98 and a superconductor filament 100, 102, respectively. Heaters 88 and 90 are in series and are supplied current (when desired) from a first heater control 104; heaters 96, 98 are in series and connect to a second heater control 106. This test system included a Hall sensor 108 to confirm that current reversal did, in fact, occur without physically reversing the current leads from the supply 12. This sensor was also used to verify that persistent operation of the magnet 14 was possible so as to demonstrate the dual function of the superconducting current reversing switch of the present invention.

Typically, the heaters (e.g., 88, 90) had a resistance of about thirty ohms. The superconducting filaments (e.g., 92, 94) were found to typically have about ten ohms resistance when warm (operation in liquid helium at 4.2K and with 50 MA of current flowing through the heaters). These resistance values, however, were shown to be non-critical to the operation of the system.

The current reversing process was performed by first turning "ON" the heaters 96, 98 and turning "OFF" the heaters 88, 90. After approximately one minute to allow switch components 80, 82 to cool and 84, 86 to warm, the magnet power supply 12 was energized and a positive current in the magnet 14 was detected using the Hall sensor/magnetometer 108. The magnet was charged to approximately 5 tesla (43.8 amps) and the voltage across the magnet was then brought to zero volts to stop the charge. The heaters 96, 98 were turned "OFF" and one minute was allowed for these switch components to cool. The magnet power supply was then brought back to zero amps and by monitoring the voltage across the magnet power leads and the hall sensor/ magnetometer, persistent mode operation was verified.

The current in the magnet power supply was again returned to 43.8 amps. The heaters 96, 98 were turned "ON" and one minute was allowed for the switches to warm. The magnet was then discharged to zero amps while monitoring both the current in the leads and the Hall sensor/ magnetometer. When zero current and field were reached, the heaters 96, 98 were again turned "OFF" and the heaters 88, 90 were turned "ON". After one minute was allowed (for the switches to cool and warm, respectively), the magnet power supply was then used to again charge the magnet. This time, negative current was detected in the magnet by seeing a negative magnetic field appear on the Hall sensor/magnetometer. The magnet was again charged to 43.8 amps and a −5 tesla magnetic field was indicated. The field-to-current ratio for negative field was seen to be the same as for positive field within the error limits expected due to hysteresis effects. Persistent mode operation of the magnet for current in the negative direction was verified by cooling switches 80, 82 and reducing the power supply to zero current.

Figure 8:
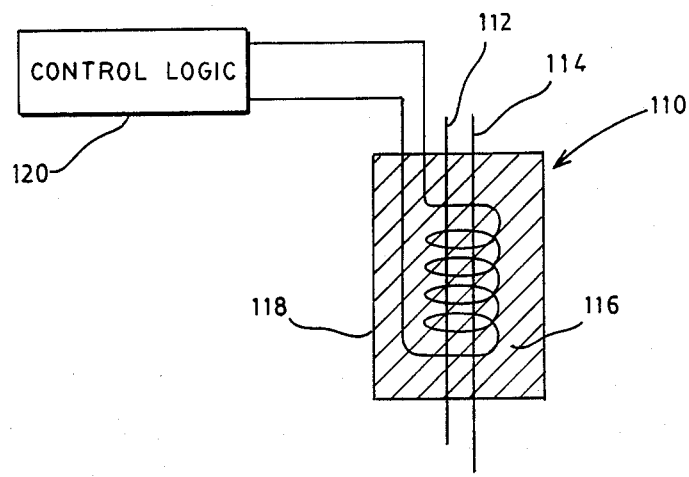
FIG. 8 is an enlarged cross-sectional drawing of an alternate embodiment of a switching unit useful in the present invention.

Although all of the above discussion involves the use of heaters to affect the resistance values of superconducting filaments, the transition from superconducting state to resistive state can be effected by other means. For example, a superconducting wire can become resistive if the wire is exposed to a high magnetic field. The field at which a superconducting wire undergoes the transition from superconducting state to resistive state is called its "critical field" or "transition field". Accordingly, a localized high magnetic field can cause the switch units to become resistive or "open". A single unit (two would be required) of such a magnetic-field-controlled switching system is illustrated at 110 in FIG. 8. As for the other embodiments, it incorporates two superconductor filaments 112, 114. These superconductor filaments 112, 114, which connect to a load as shown in FIGS. 2 and 4, are embraced with a magnet winding 118, with current supplied thereto from any control logic circuit 120 in a manner similar to use of logic unit 46 in FIGS. 2 and 4. The electrical insulative matrix 116 is shown only for physical support of the superconductive wires in the system. It is not necessary, in this case, for the matrix 116 to thermally connect the filaments 112, 114 and the magnet winding 118. It will be understood by those versed in the art that the switching unit 110 would by those versed in the art that the switching unit 110 would be cooled to below the critical temperature of the superconducting members 112, 114 in the same manner as the switching units of FIGS. 2 and 4.

From the foregoing, it will be recognized by persons versed in the art that a superconducting switch has been developed for reversing the direction of current flow through a superconducting magnet without the use of heavy-duty switches or relays. The switch is simple, inexpensive and compact. It involves no moving parts, depends on no mechanical high current contacts and can tolerate power failures. While the switch is of particular value for superconducting magnets, it can be used on any device (at any temperature) that requires high current reversing functions. When used for non-superconducting applications, only the switch units 30, 32 need a cryotemperature environment.

What is claimed:

1. A switching device for reversing flow of direct current through a load, said load supplied said current from a supply having a given polarity, which comprises:
    a first superconductor switch unit having a first pair superconductor members and first switch means for selectively switching electrical resistance of said first pair of superconductor members from substantially zero to a substantial value to resist current flow;
    a second superconductor switching unit having a second pair of superconductor members and a second switch means for selectively switching electrical resistance of said second pair of superconductor members from substantially zero to a substantial value to resist current flow;
    control means connected to said first and second switch means to selectively activate said first and second switch means; and
    interconnections between said load, said supply and said first and second switch units whereby said current flow through said load is in one direction when said first pair of superconductor members have substantially zero resistance and said second pair of superconductor members have said substantial value of resistance, and said current flow is in an opposite direction when said resistance values of said first and second switch units are reversed by said control means.

2. The switching device of claim 1 wherein:
    said first switch means is a first heater member in close proximity to , but electrically insulated from, said first pair of superconductor members, said first heater means connected to said control means for selective energization whereby said first heater member, when energized, maintains said first pair of superconductor members above their critical temperature; and said second switch means is a further heater member in close proximity to, but electrically insulated from, said second pair of superconductor members, said further heater member connected to said control means for selective energization whereby said further heater member, when energized, maintains said second pair of superconductor members above their critical temperature.

3. The switching device of claim 1 wherein:

said first switch means is a first electromagnetic coil means in close proximity, but electrically insulated from, said first pair of superconductor members, said first coil means connected to said control means for selective energization whereby said first coil means, when energized, produces a magnetic field in excess of a critical or transition field of said first pair of superconductor members; and said second switch means is a further electromagnetic coil means in close proximity to, but electrically insulated from, said second pair of superconductor members, said further coil means connected to said control means for selective energization whereby said further coil means, when energized, produces a magnetic field in excess of a critical or transition field of said second pair of superconductor members.

4. The switching device of claim 1 wherein said load is a superconductor magnet maintained at a temperature below a critical temperature for said magnet and said first and second switching units are maintained at a temperature below a critical temperature for said first and second pair of superconductor members except during energization of said first and said second switch means.

5. The switching device of claim 4 wherein said magnet is immersed in a fluid having a temperature below said critical temperature of said magnet, and said first and second switching units are immersed in a fluid having a temperature below said critical temperature of said first and second pair of superconductor members.

6. A switching device for reversing flow of direct current through a load having a first lead and a second lead, said load provided with current from a supply having a first lead and a second lead, said switching device comprising:

a first superconductor switching unit having a. a first superconductor member connected between said first lead of said supply and said first lead of said load, b. a second superconductor member connected between said second lead of said supply and said second lead of said load, said second superconductor member electrically insulated from, but thermally coupled to, said first superconductor member, and c. first switch means for selectively effecting a change in said first and second superconductor members to have a substantial electrical resistance, said first switch means electrically insulated from said first and second superconductor members;

a second superconducting switching unit having a. a third superconductor member connected between said first lead of said supply and second lead of said load, b. a fourth superconductor member connected between said second lead of said supply and said first lead of said load, said fourth superconductor member electrically insulated from, but thermally coupled to, said third superconductor member, and c. second switch means for selectively effecting a change in said third and fourth superconductor members to have a substantial electrical resistance, said second switch means electrically insulated from said third and fourth superconductor members;

cooing means for maintaining said first and second switching units at a temperature normally below a critical temperature of said superconductor members whereby said superconductor members of said first and second switching units having substantially no electrical resistance; and a control means connected to said first and second switch means for selective operation thereof to determine the electrical resistance of said first, second, third and fourth superconductor members whereby, when said first and second superconductor members have substantially no resistance and said third and fourth superconductor members have a substantial resistance, current flow through said load will be in one direction, and current flow will be reversed when said first and second superconductor members have a substantial resistance and said third and fourth superconductor members have substantially no resistance.

7. The switching device of claim 6 wherein said cooling means is a vessel containing a fluid at a temperature below said critical temperature.

8. The switching device of claim 6 wherein:

said first switch means is a first heater member thermally coupled to said first and second superconductor members whereby said first heater member, when energized by said control means, increases said temperature of said first switching unit to above said critical temperature of said first and second superconductor members; and said second switch means is a second heater member thermally coupled to said third and fourth superconductor members whereby said second heater member, when energized by said control means, increases said temperature of said second switching unit above said critical temperature of said third and fourth superconductor members.

9. The switching device of claim 6 wherein:

said first switch means is a first electromagnetic coil in close proximity to said first and second superconductor members, said first electromagnetic coil, when energized by said control means, producing a magnetic field in excess of a critical or transition field of said first and second superconductor members; and said second switch means is a second electromagnetic coil in close proximity to said third and fourth superconductor members, said second electromagnetic coil, when energized by said control means, producing a magnetic field in excess of a critical or transition field of said third and fourth superconductor members.

10. A switching device for reversing flow of direct current through a superconductor magnet having a first lead and a second lead, said superconductor magnet provided with current from a supply having a first lead and a second lead, said switching device comprising:

a first superconductor switching unit having
- a. a first superconductor member connected between said first lead of said supply and said first lead of said superconductor magnet,
- b. a second superconductor member connected between said second lead of said supply and said second lead of said superconductor member electrically insulated from, but thermally coupled to, said first superconductor member, and
- c. first switch means for selectively effecting a change in said first and second superconductor members to have a substantial electrical resistance, said first switch means electrically insulated from said first and second superconductor members;

a second superconducting switching unit having
- a. a third superconductor member connected between said first lead of said supply and said second lead of said superconductor magnet,
- b. a fourth superconductor member connected between said second lead of said supply and said first lead of said superconductor magnet, said fourth superconductor member electrically insulated from, but thermally coupled to, said third superconductor member, and
- c. second switch means for selectively effecting a change in said third and fourth superconductor members to have a substantial electrical resistance, said second switch means electrically insulated from said third and fourth superconductor members;

cooling means for maintaining said first and second switching units at a temperature normally below a critical temperature of said superconductor members whereby said superconductor members of said first and second switching units have substantially no electrical resistance; and a control means connected to said first and second switch means for selective operation thereof to determine the electrical resistance of said first, second, third and fourth superconductor members whereby, when said first and second superconductor members having substantially no resistance and said third and fourth superconductor members having a substantial resistance, current flow through said superconductor magnet will be in one direction, and current flow will be reversed when said first and second superconductor members have a substantial resistance and said third and fourth superconductor members have substantially no resistance.

11. The switching device of claim 10 wherein said superconductor magnet is immersed in a liquid having a temperature below a critical temperature for said magnet, and said first and second switching units are immersed in said liquid to effect said cooling means.

12. The switching device of claim 10 wherein:

said first switch means is a first heater member thermally coupled to said first and second superconductor members whereby said first heater member, when energized by said control means, increases said temperature of said first switching unit to above said critical temperature of said first and second superconductor members; and said second switch means is a second heater member thermally coupled to said third and fourth superconductor members whereby said second heater member, when energized by said control means, increases said temperature of said second switching unit above said critical temperature of said third and fourth superconductor members.

13. The switching device of claim 10 wherein:

said first switch means is a first electromagnetic coil in close proximity to said first and second superconductor members, said first electromagnetic coil, when energized by said control means, producing a magnetic field in excess of a critical or transition field of said first and second superconductor members; and said second switch means is a second electromagnetic coil in close proximity to said third and fourth superconductor members, said second electromagnetic coil, when energized by said control means, producing a magnetic field in excess of a critical or transition field of said third and fourth superconductor members.

* * * * *